(12) United States Patent
Wu (10) Patent No.: US 7,042,078 B2
(45) Date of Patent: May 9, 2006

(54) SEMICONDUCTOR PACKAGE

(75) Inventor: Jeng Da Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 114 days.

(21) Appl. No.: 10/776,227

(22) Filed: Feb. 12, 2004

(65) Prior Publication Data

US 2004/0212072 A1   Oct. 28, 2004

(30) Foreign Application Priority Data

Apr. 25, 2003  (TW) ............................... 92110060 A (51) Int. Cl.
*H01L 23/52* (2006.01)

(52) U.S. Cl. ...................................... 257/690; 257/676

(58) Field of Classification Search ................ 257/777, 257/723, 676, 690
See application file for complete search history.

(56) References Cited

U.S. PATENT DOCUMENTS

| 6,593,662 B1 * | 7/2003 | Pu et al. .................... 257/777 |
| 6,621,156 B1 * | 9/2003 | Kimura ....................... 257/686 |

\* cited by examiner

*Primary Examiner*—Roy Potter (57) ABSTRACT

A semiconductor package includes spacers, a chip, bonding wires, contacts, and an encapsulant. The chip is disposed on the spacers. The bonding wires are electrically connected to the chip, and the contacts are electrically connected to the bonding wires. The contacts are electrically connected to an external circuit board. The encapsulant encapsulates the spacers and the active and back surfaces of the chip so as to lower the thermal stress of the chip.

4 Claims, 8 Drawing Sheets

SEMICONDUCTOR PACKAGE

CROSS REFERENCE TO RELATED APPLICATION

This application claims the priority benefit of Taiwan patent application serial No. 092110060, filed on Apr. 25, 2003, and the full disclosure thereof is incorporated herein by reference.

BACKGROUND OF THE INVENTION

1. Field of the Invention

The present invention relates to a semiconductor package, and more particularly, to a low thermal stress semiconductor package which has a chip disposed on and spaced from a substrate.

2. Description of the Related Art

The semiconductor package has four major functions, i.e. signal distribution, power distribution, heat dissipation, and protection. In general, the semiconductor chip is formed into an enclosure, such as a single-chip module (SCM) or a chip carrier, referred to as the packaging of the semiconductor. These packaged chips, along with other components such as capacitors, resistors, inductors, filters, switches, and optical and RF components, are assembled to a printed wiring board.

As the need has arisen for lighter and more complex electronic devices, the semiconductor chip has to be manufactured for having more leads or contacts for inputting and outputting signals. For example, in a conventional plastic ball gray array (PBGA) package 10 shown in FIG. 1, a semiconductor chip 12 adheres to a substrate 14 by means of an adhesive layer 16. Bonding wires 18 are used to electrically connect the semiconductor chip 12 to the substrate 14 and an encapsulant 20 encapsulates the semiconductor chip 12 and the bonding wires 18. A plurality of solder balls 22 are disposed on the bottom surface of the substrate 14 for being attached to an external circuit board.

Figure 1:
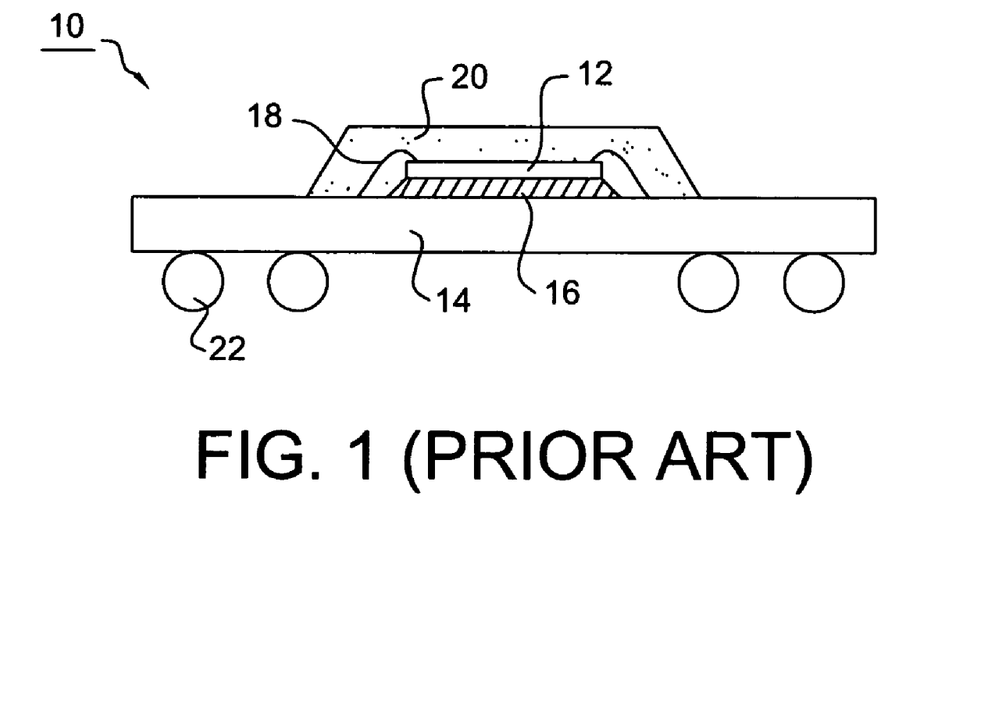
FIG. 1 is a schematic cross-sectional view of a plastic ball grid array package in the prior art.

However, the mismatch of the coefficients of thermal expansion (CTE) of the components in the package 10 leads the package 10 to warpage or stress. In addition, the mismatch of the coefficients of thermal expansion (CTE) further leads the chip 12 in the encapsulant 20 to damage.

Accordingly, there exists a need for a semiconductor package to overcome the above-mentioned drawbacks.

SUMMARY OF THE INVENTION

It is an object of the present invention to provide a low stress semiconductor package which has a chip disposed on and spaced apart from a substrate or a carrier so as to reduce the stress of the chip.

In order to achieve the above object, the present invention provides a semiconductor package comprising spacers, a chip, bonding wires, contacts, a substrate, and an encapsulant. The spacers are disposed on the substrate, and the chip is disposed on the spacers. The bonding wires are electrically connected to the chip and the contacts. The contacts are electrically connected to an external circuit board. The encapsulant encapsulates the spacers and the active and back surfaces of the chip and, therefore, the thermal stress of the package is reduced.

In the semiconductor package according to the present invention, the adhesive layer between the chip and substrate is replaced with the spacers and the encapsulant such that the chip is substantially surrounded with the encapuslant, and thus the effect of the mismatch of the coefficients of thermal expansion can be substantially reduced and the thermal stress on the chip can be substantially reduced. Further, a space is formed between the chip and substrate by the spacers and is filled with the encapsulant such that the thermal stress in the semiconductor package is modifiable by the modification of the size of the spacers or the space.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 2:
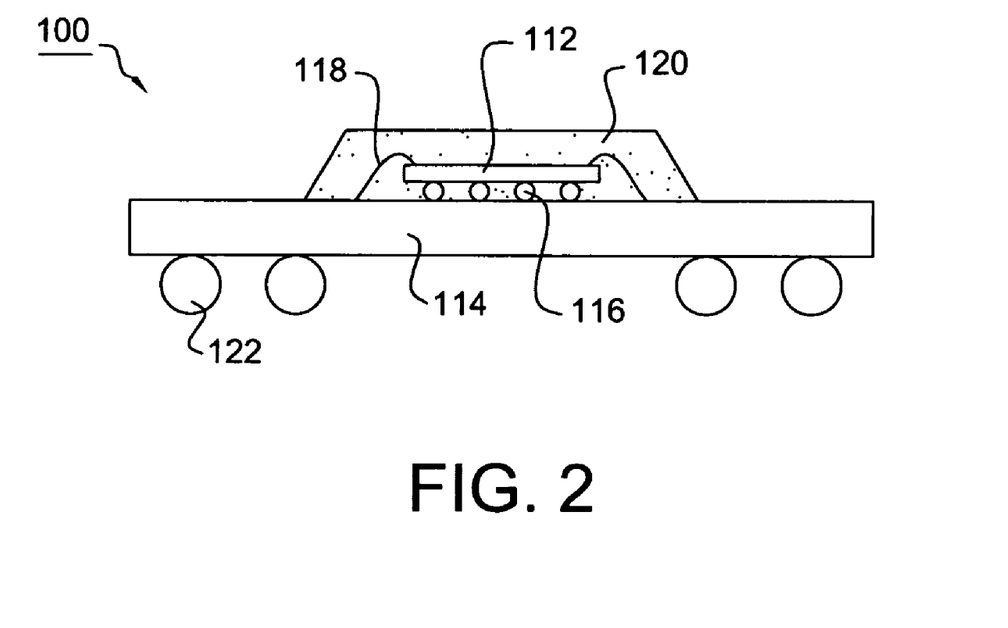
FIG. 2 is a schematic cross-sectional view of a semiconductor package according to an embodiment of the present invention.

Now referring to FIG. 2, it depicts a semiconductor package 100 according to an embodiment of the present invention. The semiconductor package 100 is a ball grid array package and has a carrier, such as a circuit board or substrate 114, and a chip 112. A plurality of spacers 116 are disposed on the substrate 114, and then the chip 112 is disposed on the spacers 116 and electrically connected to the substrate 114 by bonding wires 118. An encapsulant 120 encapsulates the chip 112, the spacers 116, and the bonding wires 118. A plurality of contacts, such as solder balls 122, are electrically connected to the bonding wires 118 and disposed on the bottom surface of the substrate 114 for being attached to an external circuit of an external circuit board.

The spacers 116 can be made of polymer or glass. The spaces 116 are not limited to be spherical as shown in the drawings, and can be other shapes, such as cylindrical and cubic. The thickness of the encapsulant 120 is about 32 mil, i.e. 800μ, the thickness of the chip 112 is about 12 mil, i.e. 300μ, and the thickness of the spacers 116 is about 1–4 mil, i.e. 25–100μ.

Figure 3:
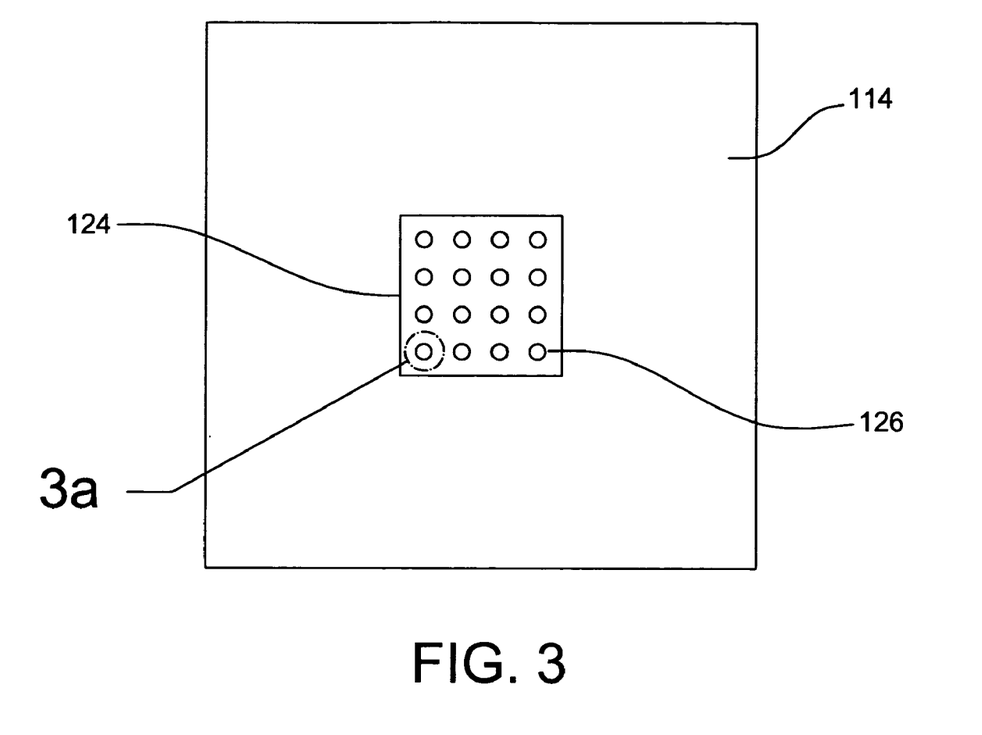
FIG. 3 is a schematic top plan view of the substrate of the semiconductor package shown in FIG. 2.
Figure 3A:
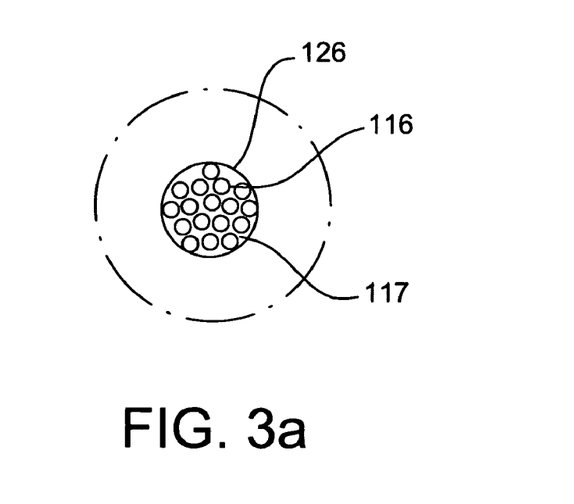
FIG. 3a is a schematic enlarged view of Area A shown in FIG. 3.

Now referring to FIGS. 3 and 3*a*, they depict the substrate 114 during the manufacturing process of the semiconductor package 100. The substrate 114 defines a chip area 124. The chip 112 is disposed on the chip area 124. During the manufacturing process of the semiconductor package 100, the spacers 116 are mixed with an adhesive 117 so as to form a mixture 126. The mixture 126 is uniformly dispensed onto the chip area 124 so as to form the uniformly distributed droplets of the mixture 126 for adhering to and supporting the chip 112. Further, the spacers 116 with a specific size are chosen and mixed with a suitable amount of the adhesive 117 such that each of the spacers 116 in the drops of the mixture 126 directly supports or upheaves the chip 112. The chip 112 can be pressed by a suitable press for being evenly or flatly disposed on the substrate 114. Further, the adhesive 117 is cured by heating and thus the chip 112 is securely attached to the substrate 114. Then, by the molding or the transfer molding process, the encapsulant 120 is molded on the substrate 114 and filled into the spaces between the droplets of the mixtures 126 so that the upper and bottom surfaces of the chip 112 are substantially surrounded or encapsulated with the encapsulant 120. The adhesive 117 can be made of any suitable materials, such as epoxy resin or silver paste.

It should be noted that the applied dosage of the mixture 126 is controlled such that the droplets of the mixture 126 or the spacers 116 support the chip 112 and the encapsulant 120 is easily filled into the spaces between the chip 112 and the substrate 114 and between the droplets of the mixture 126.

Figure 4:
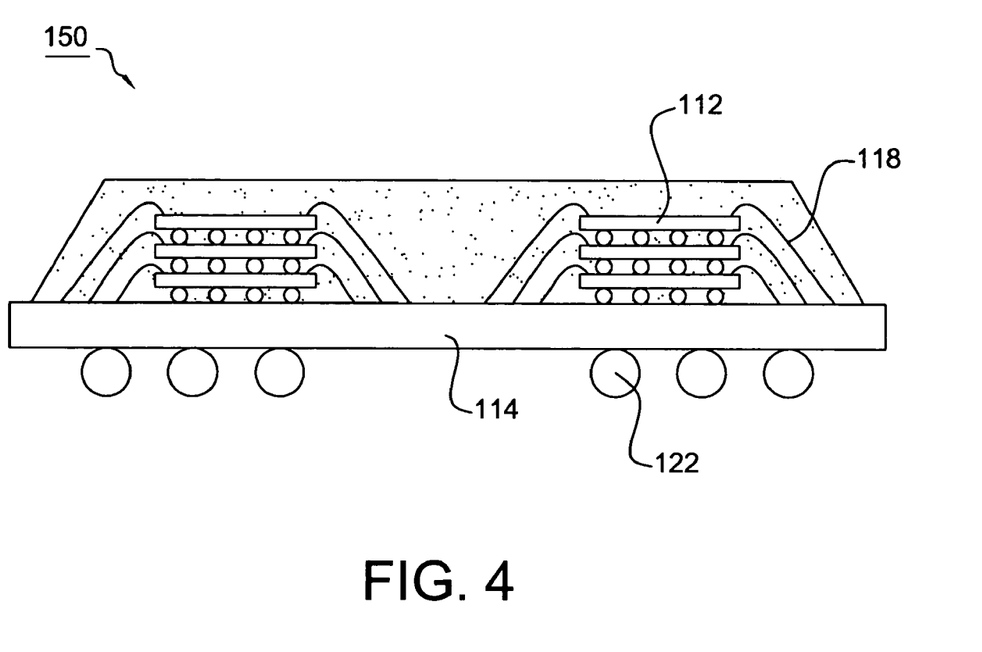
FIG. 4 is a schematic cross-sectional view of a semiconductor package according to a further embodiment of the present invention.

Referring to FIG. 4, it depicts a semiconductor package 150 according to a further embodiment of the present invention. The semiconductor package 150 is similar to the semiconductor package 100 wherein the similar elements are designated with the same numerals. The semiconductor package 150 is a stacked/multichip ball grid array package. The semiconductor package 150 comprises a plurality of chips 112 stacked and disposed on a substrate 114. A plurality of spacers 116 are disposed between the chips 112 and between the chip 112 and the substrate 114.

Figure 5:
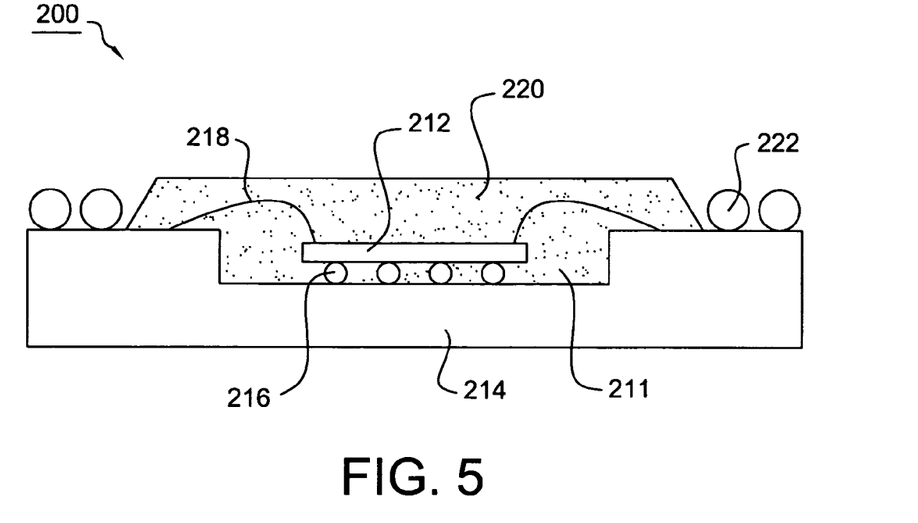
FIG. 5 is a schematic cross-sectional view of a semiconductor package according to another embodiment of the present invention.

Referring to FIG. 5, it depicts a semiconductor package 200 according to another embodiment of the present invention. The semiconductor package 200 is similar to the semiconductor package 100 wherein the similar elements are designated with the similar numerals. The semiconductor package 200 is a cavity-down ball grid array package. The semiconductor package 200 comprises a substrate 214 having a cavity 211. A plurality of spacers 216 are disposed in the cavity 211 of the substrate 214. A chip 212 is disposed on the spacers 216.

Figure 6:
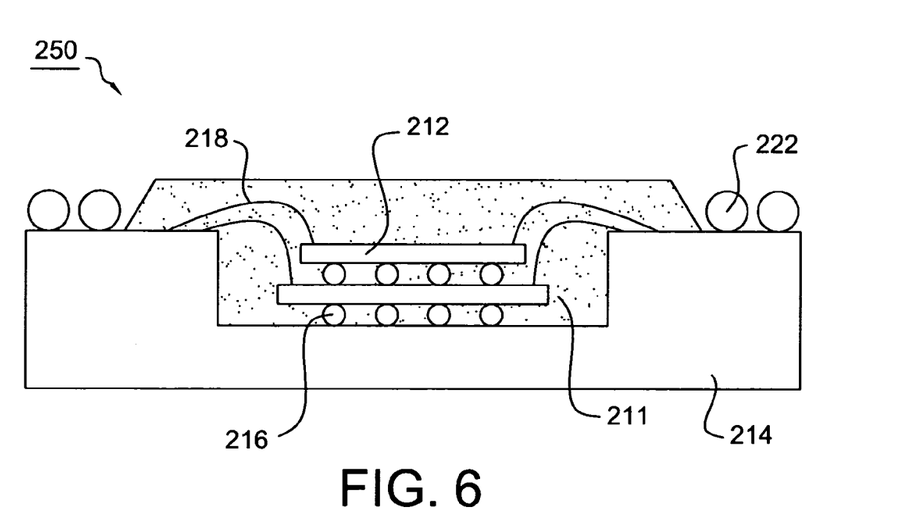
FIG. 6 is a schematic cross-sectional view of a semiconductor package according to a still further embodiment of the present invention.

Referring to FIG. 6, it depicts a semiconductor package 250 according to a still further embodiment of the present invention. The semiconductor package 250 is similar to the semiconductor package 200 wherein the similar elements are designated with the same numerals. The semiconductor package 250 is a stacked/multichip cavity-down ball grid array package. The semiconductor package 250 comprises a plurality of chips 212 stacked and disposed in a cavity 211 of a substrate 214. A plurality of spacers 216 are disposed between the chips 212 and between the chip 212 and the substrate 214.

Figure 7:
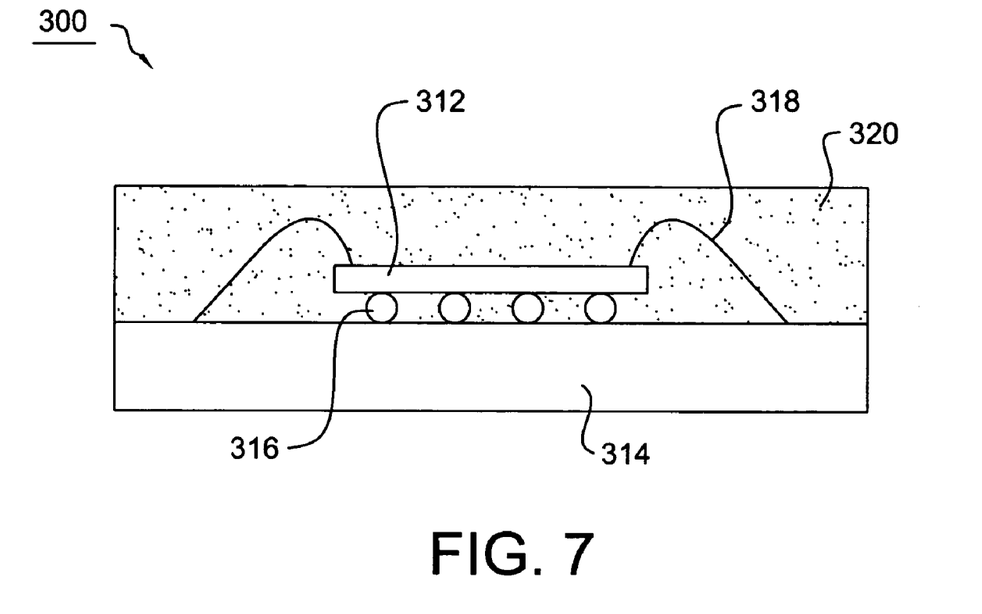
FIG. 7 is a schematic cross-sectional view of a semiconductor package according to yet another embodiment of the present invention.

Referring to FIG. 7, it depicts a semiconductor package 300 according to yet another embodiment of the present invention. The semiconductor package 300 is similar to the semiconductor package 100 wherein the similar elements are designated with the similar numerals. The semiconductor package 300 is a chip scale package. The semiconductor package 300 comprises a substrate 314. A plurality of spacers 316 are disposed on the substrate 314. A chip 312 is disposed on the spacers 316.

Figure 8:
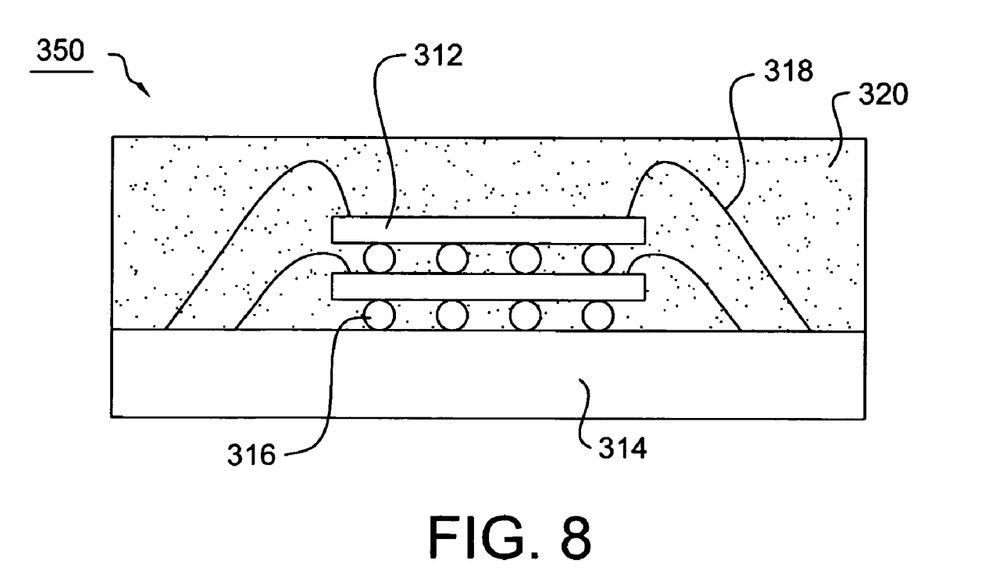
FIG. 8 is a schematic cross-sectional view of a semiconductor package according to a still further embodiment of the present invention.

Referring to FIG. 8, it depicts a semiconductor package 350 according to a still further embodiment of the present invention. The semiconductor package 350 is similar to the semiconductor package 300 wherein the similar elements are designated with the same numerals. The semiconductor package 350 is a stacked/multichip chip scale package. The semiconductor package 350 comprises a plurality of chips 312 stacked and disposed on a substrate 314. A plurality of spacers 316 are disposed between the chips 312 and between the chip 312 and the substrate 314.

Figure 9:
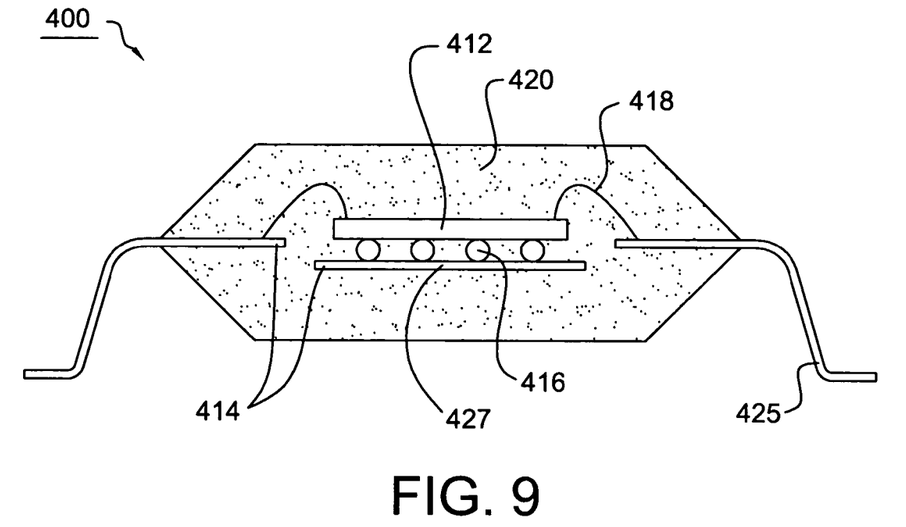
FIG. 9 is a schematic cross-sectional view of a semiconductor package according to yet another embodiment of the present invention.

Referring to FIG. 9, it depicts a semiconductor package 400 according to yet another embodiment of the present invention. The semiconductor package 400 is similar to the semiconductor package 100 wherein the similar elements are designated with the similar numerals. The semiconductor package 400 is a small outline package (SOP), a thin small outline package (TSOP), or a quad flat package (QFP). The semiconductor package 400 comprises a carrier, i.e. a lead frame 414. A plurality of spacers 416 are disposed on a die pad 427 of the lead frame 414. A chip 412 is disposed on the spacers 416. The chip 412 is electrically connected to a plurality of contacts of the lead frame 414, i.e. leads 425 of the lead frame 414, by means of a plurality of bonding wires 418. The leads 425 can be electrically connected to an external circuit board by means of the surface mount technology.

Figure 10:
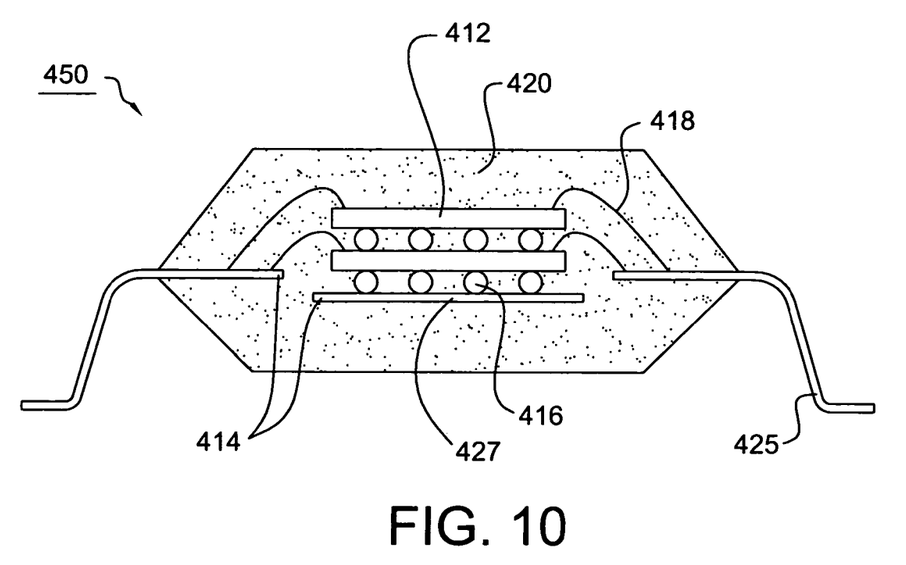
FIG. 10 is a schematic cross-sectional view of a semiconductor package according to a still further embodiment of the present invention.

Referring to FIG. 10, it depicts a semiconductor package 450 according to a still further embodiment of the present invention. The semiconductor package 450 is similar to the semiconductor package 400 wherein the similar elements are designated with the same numerals. The semiconductor package 450 is a stacked/multichip package. The semiconductor package 450 comprises a plurality of chips 412 stacked and disposed on a die pad 427 of a lead frame 414. A plurality of spacers 416 are disposed between the chips 412 and between the chip 412 and the die pad 427 of the lead frame 414.

Figure 11:
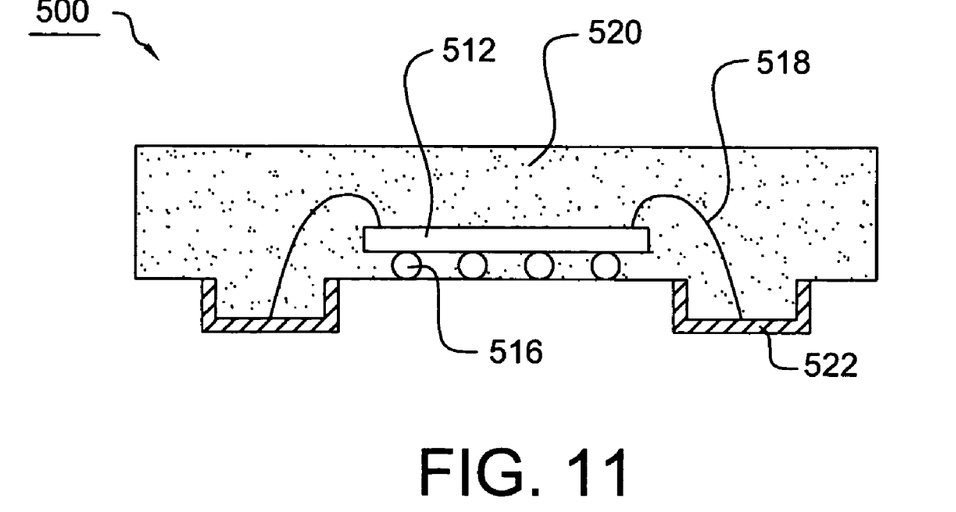
FIG. 11 is a schematic cross-sectional view of a semiconductor package according to yet another embodiment of the present invention.

Referring to FIG. 11, it depicts a semiconductor package 500 according to yet another embodiment of the present invention. The semiconductor package 500 is similar to the semiconductor package 100 wherein the similar elements are designated with the similar numerals. The semiconductor package 500 is a bump chip carrier (BCC) package or a quad flat no-lead (QFN) package which can be disposed and electrically connected to an external circuit board by means of the surface mount technology. The semiconductor package 500 comprises a chip 512 disposed on a plurality of spacers 516. The chip 512 is electrically connected to a plurality of resin bumps or leads 522 by means of a plurality of bonding wires 518. An encapsulant 520 encapsulates the chip 512, the spacers 516 and the bonding wires 518.

Figure 12:
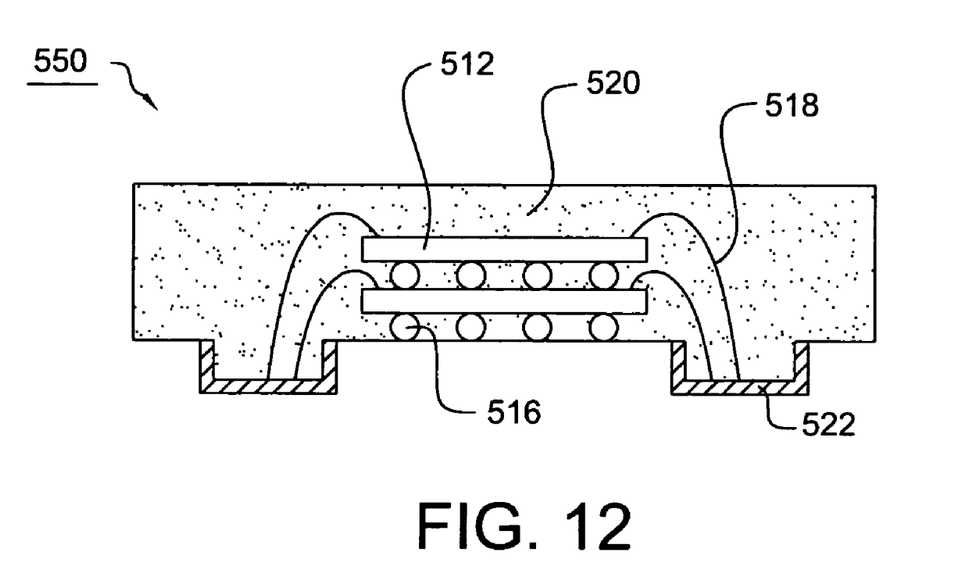
FIG. 12 is a schematic cross-sectional view of a semiconductor package according to a still further embodiment of the present invention.

Referring to FIG. 12, it depicts a semiconductor package 550 according to a still further embodiment of the present invention. The semiconductor package 550 is similar to the semiconductor package 500 wherein the similar elements are designated with the same numerals. The semiconductor package 550 is a stacked/multichip package. The semiconductor package 550 comprises a plurality of chips 512 stacked and disposed on a plurality of spacers 516. There are also spacers 516 disposed between the chips 512.

Figure 13:
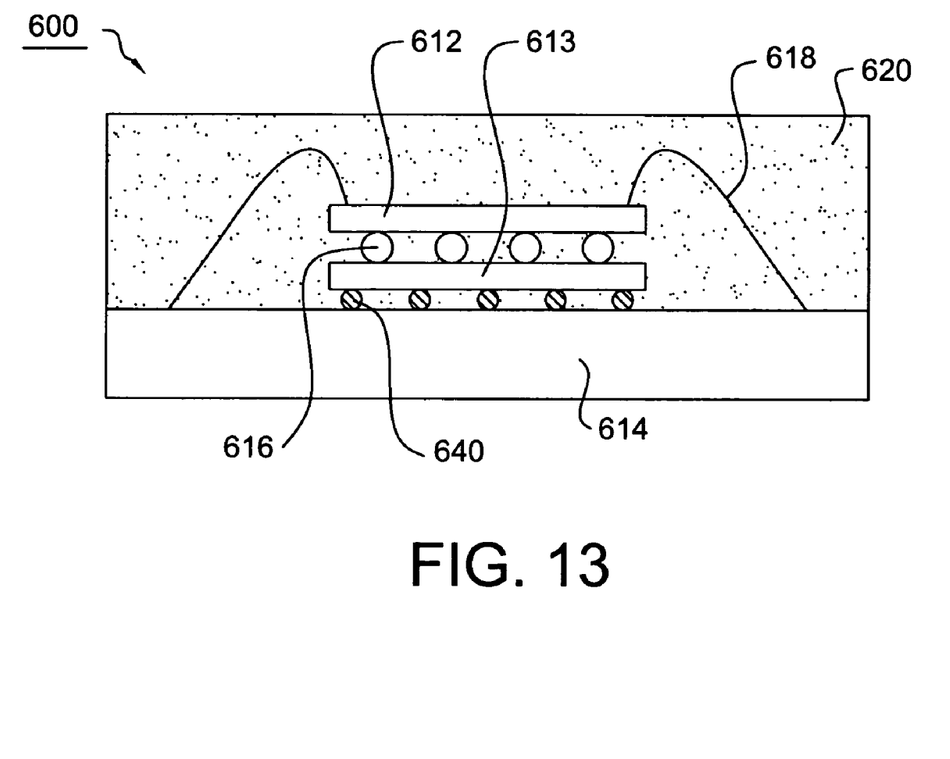
FIG. 13 is a schematic cross-sectional view of a semiconductor package according to yet another embodiment of the present invention.

Referring to FIG. 13, it depicts a semiconductor package 600 according to yet another embodiment of the present invention. The semiconductor package 600 is similar to the semiconductor package 300 wherein the similar elements are designated with the same numerals. The semiconductor package 600 is a stacked/multichip chip scale package. The semiconductor package 600 comprises two chips 612, 613 stacked and disposed on a substrate 614. The chip 613 is electrically connected to the substrate 614 through bumps 640 by means of the flip chip technology. A plurality of spacers 616 are disposed on the chip 613 and the chip 612 is disposed on the spacers 616. Then, the chip 612 is electrically connected to the substrate 614 through bonding wires 618.

As indicated in the above description, in the semiconductor package according to the present invention, the adhesive layer between the chip and substrate is replaced with the spacers and the encapsulant such that the chip is substantially surrounded with the encapsulant, and thus the effect of the mismatch of the coefficients of thermal expansion can be substantially reduced and the thermal stress on the chip can be substantially reduced. Further, a space is formed between the chip and substrate by the spacers and is filled with the encapsulant such that the thermal stress in the semiconductor package is modifiable by the modification of the size of the spacers or the space.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A semiconductor package, comprising:
   a lead frame having a die pad, a plurality of inner leads and a plurality of outer leads electrically connected to the inner leads for being electrically connected to an external circuit;
   a plurality of first spacers disposed on the die pad;
   a first chip disposed on the first spacers and defining an active surface and a back surface;
   a plurality of first bonding wires electrically connecting the first chip to the inner leads; and
   an encapsulant encapsulating the first spacers, the active surface and the back surface of the first chip, and the first bonding wires.

2. The semiconductor package as claimed in claim 1, further comprising:
   a plurality of second spacers disposed on the first chip;
   a second chip disposed on the second spacers; and
   a plurality of second bonding wires electrically connecting the second chip to the inner leads,
   wherein the encapsulant further encapsulates the second spacers, the second chip, and the second bonding wires.

3. The semiconductor package as claimed in claim 1, further comprising a plurality of adhesives mixed with the spacers and disposed on the lead frame.

4. A semiconductor package, comprising:
   a carrier;
   a plurality of first spacers disposed on the carrier;
   a first chip disposed on the first spacers and having an active surface and a back surface;
   a plurality of contacts disposed on the carrier for being electrically connected to an external circuit;
   a plurality of first bonding wires electrically connecting the first chip to the contacts; and
   an encapsulant encapsulating the first spacers, the active surface and the back surface of the first chip, and the first bonding wires;
   wherein the carrier is a lead frame having a die pad on which the first spacers are disposed.

* * * * *